United States Patent
Cheng et al.

(10) Patent No.: US 9,056,766 B2
(45) Date of Patent: Jun. 16, 2015

(54) METHOD OF FORMING A BOND RING FOR A FIRST AND SECOND SUBSTRATE

(71) Applicant: TAIWAN SEMICONDUCTOR MANUFACTURING COMPANY, LTD., Hsin-Chu (TW)

(72) Inventors: Chun-Wen Cheng, Zhubei (TW); Hsueh-An Yang, Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/460,047

(22) Filed: Aug. 14, 2014

(65) Prior Publication Data

US 2014/0357007 A1 Dec. 4, 2014

Related U.S. Application Data

(62) Division of application No. 12/891,062, filed on Sep. 27, 2010, now Pat. No. 8,810,027.

(51) Int. Cl.
*H01L 21/00* (2006.01)
*B81C 1/00* (2006.01)
*H01L 23/02* (2006.01)

(52) U.S. Cl.
CPC ............ *B81C 1/00269* (2013.01); *H01L 23/02* (2013.01); *B81C 2203/019* (2013.01); *H01L 2924/0002* (2013.01); *B81C 1/0038* (2013.01); *B81C 2203/0118* (2013.01)

(58) Field of Classification Search
None
See application file for complete search history.

(56) References Cited

U.S. PATENT DOCUMENTS

| | | | |
|---|---|---|---|
| 6,596,117 | B2 | 7/2003 | Hays et al. |
| 7,067,397 | B1 | 6/2006 | Chang-Chien et al. |
| 7,442,570 | B2 * | 10/2008 | Nasiri et al. ............. 438/48 |
| 8,159,059 | B2 | 4/2012 | Maeda |
| 8,647,962 | B2 | 2/2014 | Liu et al. |
| 8,710,638 | B2 | 4/2014 | Wu |
| 2002/0000646 | A1 | 1/2002 | Gooch et al. |
| 2002/0179921 | A1 | 12/2002 | Cohn |
| 2007/0117275 | A1 | 5/2007 | DCamp et al. |
| 2008/0128828 | A1 | 6/2008 | Nakamura |
| 2009/0114016 | A1 | 5/2009 | Nasiri et al. |
| 2010/0178732 | A1 * | 7/2010 | Wu et al. ............. 438/109 |

FOREIGN PATENT DOCUMENTS

WO WO 2008023465 A1 * 2/2008 ............. B81B 3/00

* cited by examiner

*Primary Examiner* — Andres Munoz
(74) *Attorney, Agent, or Firm* — Haynes and Boone, LLP

(57) ABSTRACT

One method includes providing a first substrate; the first substrate may include a first MEMS device and a second MEMS device. A second substrate is also provided. The first substrate is bonded to the second substrate. The bonding may include forming a first bond ring around the first MEMS device and forming a second bond ring around the second MEMS device, wherein the second bond ring also encircles the first bond ring. In an embodiment, the eutectic point of the materials of the second bond ring is not reached during the bonding.

21 Claims, 4 Drawing Sheets

METHOD OF FORMING A BOND RING FOR A FIRST AND SECOND SUBSTRATE

CROSS-REFERENCE TO RELATED APPLICATIONS

This application is a divisional application of U.S. application Ser. No. 12/891,062, which was filed on Sep. 27, 2010, the entire disclosure of which is incorporated herein by reference.

BACKGROUND

In semiconductor technology, products may include devices in which one semiconductor substrate is bonded to another substrate. Typical applications of this include microelectromechanical system (MEMS) devices. Example MEMS devices include accelerometers, gyroscopes, pressure sensors, bio-MEMS, optical switching devices, and the like. MEMS devices frequently require a hermetic cavity in the device where a vacuum or controlled atmosphere is required. This hermetic cavity may be difficult to sufficiently maintain when two substrates are bonded together. For example, a bond ring (e.g., sealing ring) adjoining the substrates and surrounding the hermetic cavity may degrade with the chemical and mechanical stress applied in processing the device. Such stresses may cause corrosion of the bond ring, cracking of the bond ring and/or substrate, and/or other issues that affect the integrity of the bond ring and device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
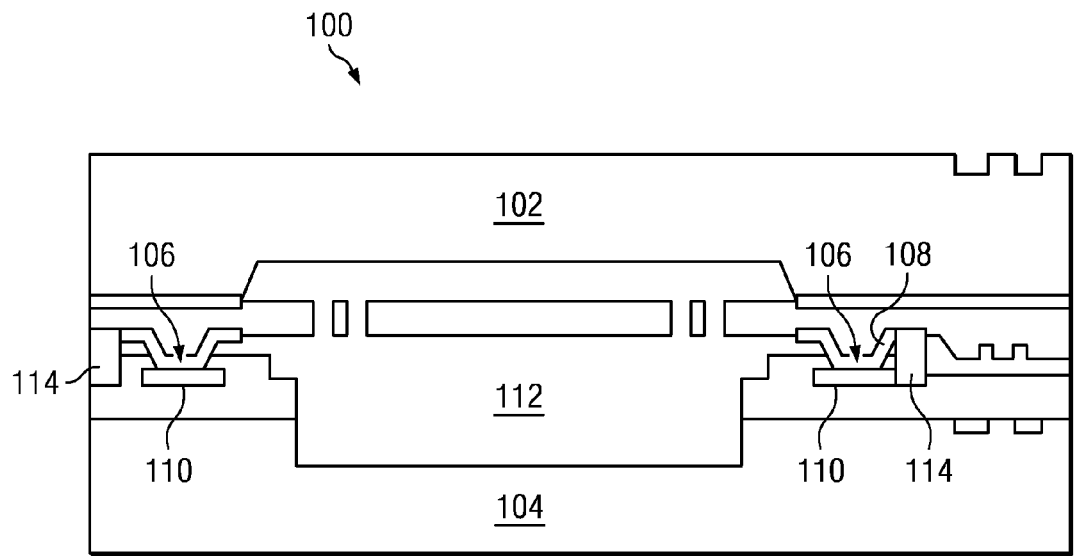
FIG. 1 is a cross-sectional view of an embodiment of two substrates bonded together according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing steps and/or features of a device may be only briefly described, such steps and/or features being well known to those of ordinary skill in the art. Also, additional processing steps or features can be added and certain of the following processing steps or features can be removed and/or changed while still implementing the claims. Thus, the following description should be understood to represent examples only, and are not intended to suggest that one or more steps or features is required.

It is further understood that the present disclosure refers generally to bonding two substrates. The substrates described herein may take various forms including but not limited to wafers (or portions thereof) or substrates of individual devices such as chips (e.g., fabricated on a wafer). Various features may be formed on the substrate including integrated circuits including those formed by CMOS-based processes, MEMS devices, image sensors, and the like. Furthermore, as described above, specific embodiments may be described herein which are exemplary only and not intended to be limiting. For example, embodiments that refer to a substrate being a MEMS substrate, a CMOS substrate, or the like are exemplary only and not intended to limit the disclosure to any particular technology. A semiconductor device may include active devices such as p-channel field effect transistors (PFETs), n-channel field effect transistors (NFETS), metal-insulator-semiconductor field effect transistor (MOSFET) including complementary MOSFET (CMOS), high voltage transistors, high frequency transistors, and/or other suitable components. A semiconductor device may include passive devices such as resistors, capacitors, inductors, and/or fuses. A substrate including a semiconductor device, an integrated circuit (or portion thereof), designed and formed by a CMOS-based processes may be referred to herein as a CMOS substrate. A substrate including a MEMS device may be referred to herein as a MEMS substrate. A MEMS device may include a variety of structures or elements operable for mechanical movement. The structures and arrangement thereof depend on the desired functionality of the device. Exemplary MEMS devices include motion sensors (e.g., gyroscope, accelerometer, etc), a radio frequency MEMS device (e.g., RF switch, filter), an oscillator, a microphone, an optical device (including MOEMS device), pressure sensor devices, and/or other suitable MEMS device. In an embodiment, a MEMS device may be fabricated using typical processes of a CMOS fabrication process, including, for example, photolithography, etching processes, deposition processes, plating processes, and other suitable processes.

Referring now to FIG. 1, illustrated is a device 100 having a first substrate 102 and a second substrate 104. In an embodiment, the first substrate 102 is a MEMS wafer, or a wafer with at least one MEMS feature formed thereon. In an embodiment, the second substrate 104 is a CMOS wafer, or a wafer with at least one semiconductor device formed thereon by a CMOS or CMOS related process. As described above, in different embodiments the first substrate 102 and the second substrate 104 may take different forms.

In one example, at least one of the first substrate 102 and the second substrate 104 is a silicon wafer. The substrates may alternatively or additionally include other elementary semiconductors, such as germanium. The substrates may also include a compound semiconductor, such as silicon carbide, gallium arsenic, indium arsenide, and indium phosphide. Alternatively, the substrates may include a non-semiconductor material such as glass, quartz, calcium fluoride, and/or other suitable material. The first and second substrate 102 and 104 include a plurality of features formed thereon providing a semiconductor device or portion thereof, MEMS device or portion thereof, and/or other suitable feature. In an embodiment, one of the first substrate 102 and the second substrate 104 is a capping substrate.

The first substrate 102 is bonded to the second substrate 104. The bonded first substrate 102 and the second substrate 104 may include a cavity having a controlled environment for a MEMS device on the first substrate 102. One example of such a cavity is a hermetic cavity illustrated by region 112. The first substrate 102 is bonded to the second substrate 104 using bond ring 106. (Additional bonding sites may be provided that provide physical and/or electrical connection between the first substrate 102 and 104.) The bond ring 106 is formed by the connection of a bonding element 108 on the first substrate 102 and a bonding element 110 on the second substrate 104. A bond ring may also be referred to as a seal ring. For example, the bond ring 106 may provide a boundary (e.g., seal) for the region 112. The bond ring 106 may be formed using a eutectic bonding process. A eutectic bond may be formed between elements 108 and 110. The eutectic bonding can be provided between any two materials (e.g., alloy) suitable for the bonding temperature boundary condition. For example, the eutectic bonding process may include metal/metal bonding and/or metal/semiconductor bonding such as, germanium (Ge)/ aluminum (Al) bonding, Ge/gold (Au) bonding, silicon (Si)/Au bonding, Si/Al bonding, indium (In)/Au bonding, Au/Au bonding, solder/Au eutectic bonding, and/or other suitable materials. As but one example, in an embodiment the element 108 is germanium and the element 110 is aluminum. In another embodiment, element 108 is silicon and element 110 is gold. In alternative embodiments, a eutectic composition (e.g., alloy) is deposited on one or more of the substrates 102 and 104.

The bonding of the first substrate 102 and the second substrate 104 using only a single bond ring, i.e., bond ring 106, would present several disadvantages. For example, the bond ring 106 may be impacted chemically and/or physically by subsequent processing of the substrates 102 and 104, and/or presence of residual chemicals on or between the substrates 102 and 104. Furthermore, the structural strength of the bond ring 106 may provide insufficient stress-reduction, which may result in cracking of the substrates of bond ring 106 during the dicing process. Such issues may result in the reduction and/or loss of hermeticity of the region 112. For example, through-silicon-via (TSV) processing may be performed on the second substrate 104. The TSV process may include patterning the vias, etching the via holes, sputtering, and/or plating conductive material to create the vias and connection thereto. One or more of the chemicals used in these processes may attack (e.g., corrode) the bond ring 106 resulting in the loss of hermeticity in region 112.

Figure 6:
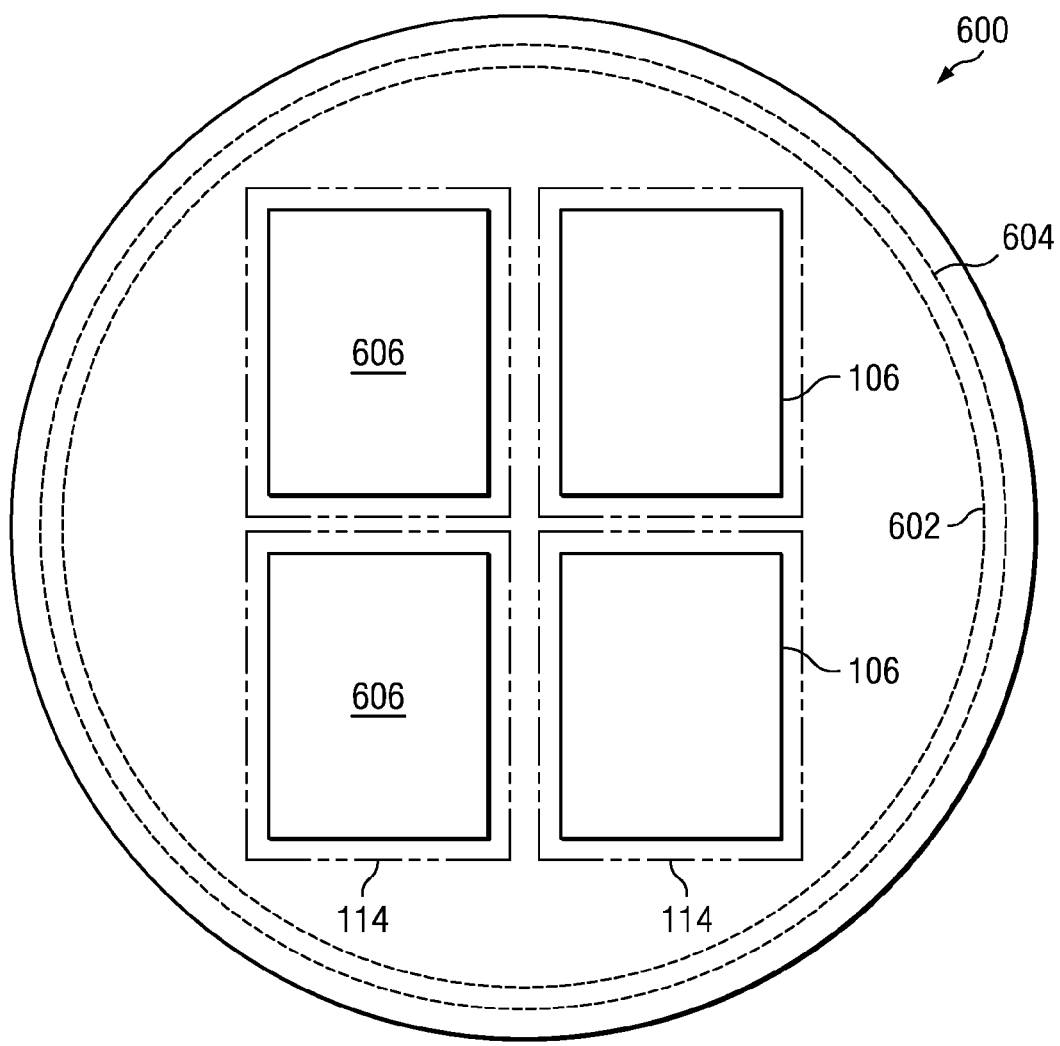
FIG. 6 is a layout view of an embodiment of two substrates bonded together according to aspects of the present disclosure.

Thus, according to the present disclosure, a second bond ring 114 is provided which connects the first substrate 102 and the second substrate 104. (It is noted that FIG. 1 illustrates the substrates in cross-section. A layout is illustrated in FIG. 6.) The second bond ring 114 encircles (e.g., surrounds) the first bond ring 106. The bond ring 114 includes an organic material. The organic material is selected such that it can withstand the elevated temperatures required of the remaining fabrication (e.g., bonding) processes. In an embodiment, the bond ring 114 includes a polymer material. In a further embodiment, the bond ring 114 is polyimide. Other example compositions include photoresist and/or other suitable organic materials. The bond ring 114 material may be selected for its compatibility with a CMOS process technology. In an embodiment, the material for the bond ring 114 is formed on the second substrate 104 (e.g., CMOS wafer) prior to the bonding of the substrates.

In an embodiment, the bond ring 114 is between approximately 2 µm and approximately 5 µm in width. In an embodiment, approximately 40 µm of organic material is deposited on one of the first substrate 102 and the second substrate 104 to form the bond ring 114. However, the thickness (as well as other properties) of the material may vary depending on the topography of, for example, the second substrate 104. These dimensions are by way of example and not intended to be limiting. Furthermore, the material may be tensile the dimensions may change as a result of the bonding process parameters. The bond ring 114 may provide a mechanical connection and not an electrical connection between the substrates.

The device 100 illustrates a portion of two wafers, substrates 102 and 104, which are bonded together. The device 100 typically includes a plurality of individual devices (e.g., chips), which are later separated from each other. As such, the device 100 includes a plurality of hermetic chambers 112, each with bond rings 106 and 114 surrounding them. FIG. 6 illustrates an embodiment of a layout that may be associated with the device 100. The bond ring 106 and/or 114 may be referred to as a device-level bond ring. A device-level bond ring is such that it is on one single chip or die.

Figure 2:
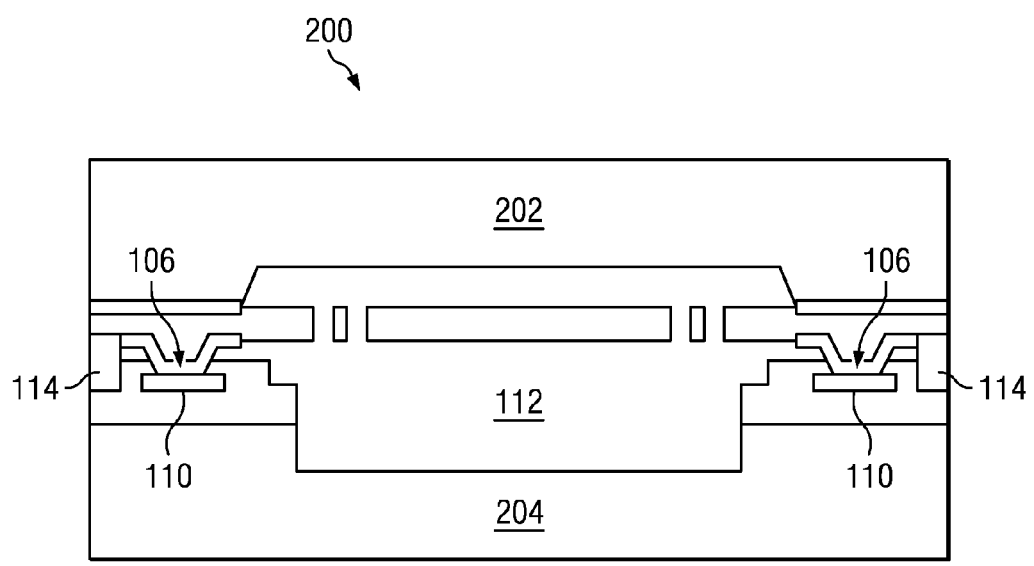
FIG. 2 is a cross-sectional view of the embodiment of FIG. 1 at a subsequent stage of manufacturing.

Referring now to FIG. 2, illustrated is a device 200, which is a portion the device 100 at a subsequent stage of manufacturing. Specifically, the device 200 illustrates the substrates 102 and 104 after the dicing process (e.g., sawing of the wafers into discrete devices or chips). The device 200 may be referred to as a chip. The substrate 102 has been diced providing substrate 202; the substrate 104 has been diced providing substrate 204. As illustrated, the resulting device 200 has two bond rings: bond ring 106 and bond ring 114, which are described above with reference to FIG. 1. Though described herein as having two bond rings, the device 200 may include any number of bond rings surrounding the hermetic region 112. For example, the bond ring 114 may be repeated any number of times.

Figure 3:
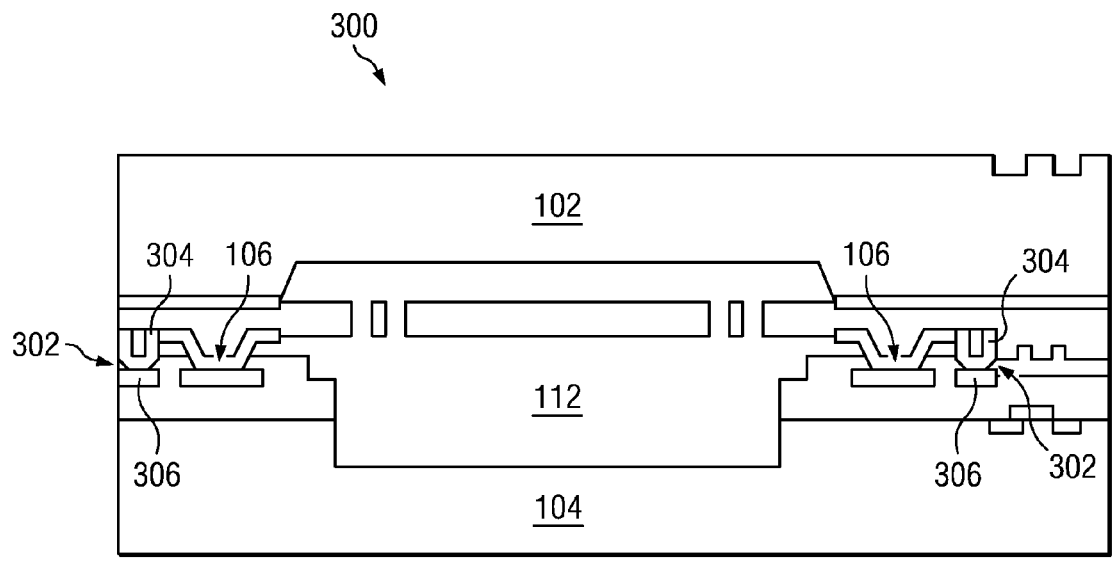
FIG. 3 is a cross-sectional view of another embodiment of two substrates bonded together according to aspects of the present disclosure.

Referring now to FIG. 3, illustrated is a device 300 which includes the bonding of two substrates (wafers) according to another embodiment of the present disclosure. The device 300 includes a first substrate 102, a second substrate 104, a hermetic region 112, and a first bond ring 106, which are substantially similar to as described above with reference to FIG. 1.

The device 300 further includes a second bond ring 302. The bond ring 106 and/or 302 may be referred to as a device-level bond ring. The bond ring 302 is formed by the connection of a bonding element 304 on the first substrate 102 and a bonding element 306 on the second substrate 104. The bond ring 302 may be formed using a eutectic bonding process between the elements 304 and 306. The eutectic bonding process can be applied between any two materials (e.g., alloy) suitable for the bonding temperature boundary condition. For example, the eutectic bonding process may include metal/metal bonding and/or metal/semiconductor bonding such as, Ge/Al bonding, Ge/Au bonding, Si/Au bonding, Si/Al bonding, Al/amorphous carbon bonding, In/Au bonding, Au/Au bonding, solder/Au eutectic bonding, and/or other suitable materials. As but one example, in an embodiment, the element 304 is germanium and the element 306 is aluminum. As another example, the element 304 is silicon and the element 306 is gold. In alternative embodiments, a eutectic composition (e.g., alloy) is deposited on one or more of the substrates 102 and 104. The bond ring 302 may provide a mechanical connection and not an electrical connection between the substrates.

Thus, in an embodiment, the bond ring 302 and the bond ring 106 are both eutectic bonds. In the embodiment, the bond ring 302 includes the same material as the bond ring 106. Thus, in some embodiments, the bond ring 302 and the bond ring 106 have the same eutectic point. In other embodiments, the bond ring 302 and the bond ring 106 include at least one different material from each other. As but one example, the bond ring 106 may include an Al/Ge eutectic bond and the bond ring 302 may include an Al/amorphous-silicon bond. Thus, in some embodiments, the bond ring 302 and the bond ring 106 have different eutectic points. This allows the additional bond ring 302 to serve as a bump that controls the gap between substrates 102 and 104. (The gap between the first substrate 102 and second substrate 104 may be less than approximately 100 µm.) In an embodiment, during the bonding of the substrates 102 and 104 the bond ring 302 does not reach its eutectic point.

Figure 7:
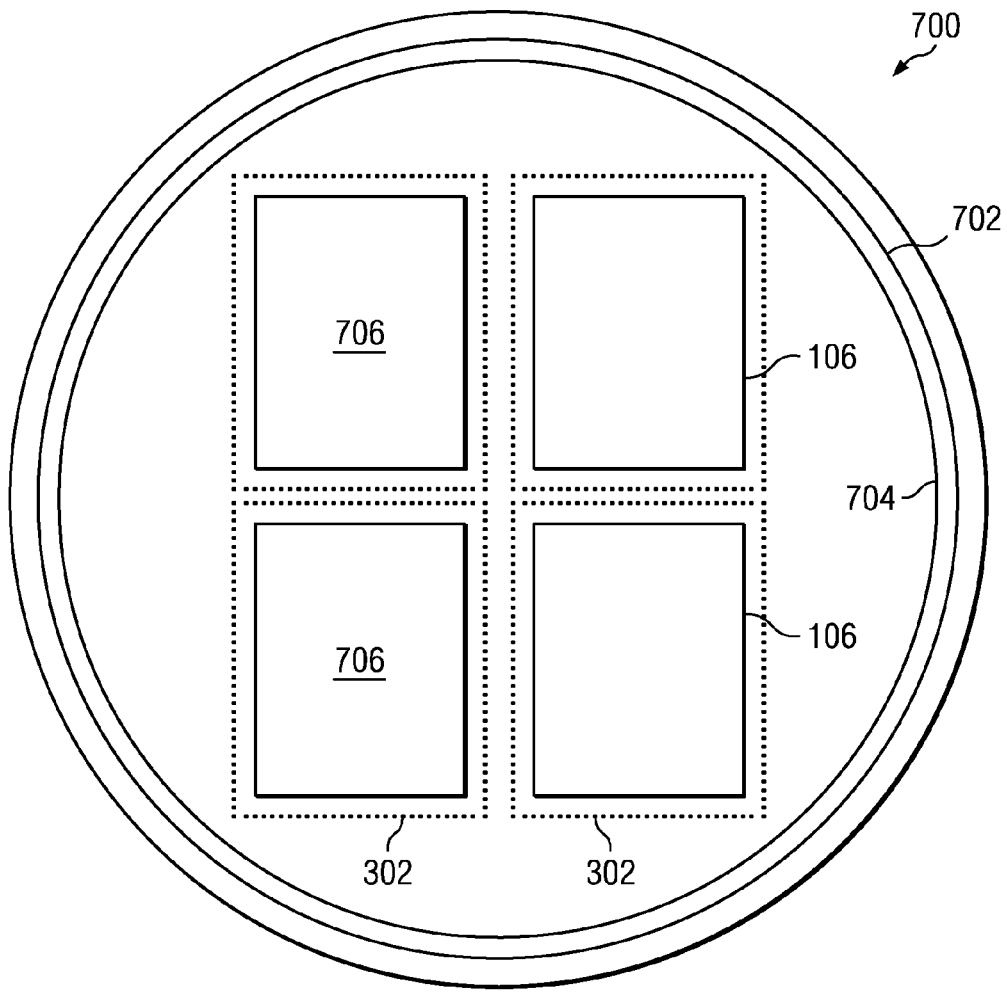
FIG. 7 is a layout view of another embodiment of two substrates bonded together according to aspects of the present disclosure.

The device 300 illustrates a portion of two wafers, substrates 102 and 104, which are bonded together. The device 300 typically includes a plurality of individual devices (e.g., chips), which are later separated from each other. As such, the device 300 includes a plurality of hermetic chambers 112, each with bond rings 106 and 302 surrounding them. FIG. 7 illustrates an embodiment of a layout that may be associated with the device 300.

Figure 4:
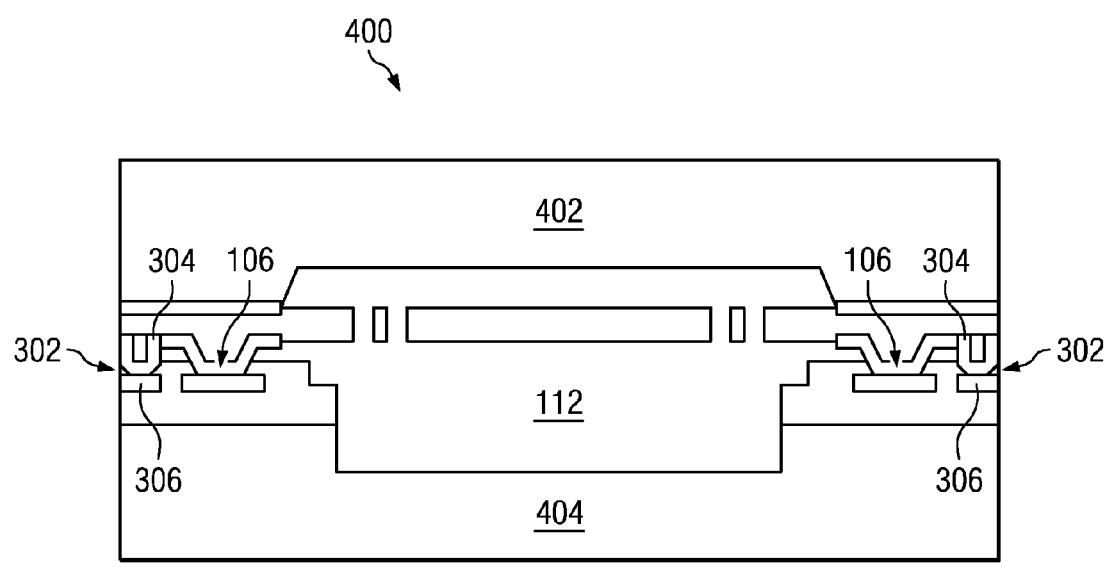
FIG. 4 is a cross-sectional view of the embodiment of FIG. 3 at a subsequent stage of manufacturing.

Referring now to FIG. 4, illustrated is a device 400, which is a portion the device 300 at a subsequent stage of manufacturing. Specifically, the device 400 illustrates the substrates 102 and 104 after the dicing process (e.g., sawing the wafers into discrete devices or chips). The device 400 may be referred to as a chip. The substrate 102 has been diced providing substrate 402; the substrate 104 has been diced providing substrate 404. As illustrated, the resulting device 400 has two bond rings: bond ring 106 and bond ring 302, which are described above with reference to FIGS. 1 and 3, respectively. Though described herein as having two bond rings, the device 400 may include any number of bond rings surrounding the hermetic region 112. For example, the bond ring 302 may be repeated any number of times.

Figure 5:
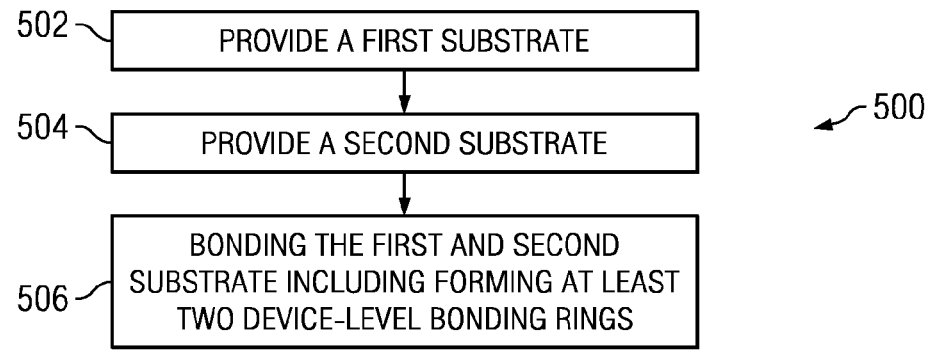
FIG. 5 is a flowchart of an embodiment of a method of bonding two substrates together according to aspects of the present disclosure.

Referring now to FIG. 5, illustrated is a method 500 which may be used to fabricate the devices 100, 200, 300, and/or 400. The method 500 begins at step 502 where a first substrate is provided. The first substrate may be substantially similar to the substrate 102, described above with reference to FIG. 1. The first substrate may be a MEMS substrate, a CMOS substrate, a capping substrate, and/or other suitable substrate. The first substrate may be a wafer. The wafer may include a plurality of devices formed thereon. The first substrate includes at least two bond ring sites (e.g., two regions where a bond ring can be formed or adhered to) for each of a plurality of devices formed thereon. In an embodiment, a ring of a first material is provided on the first substrate, where the first material is a material suitable for eutectic bonding with a complementary material formed on the second substrate, discussed below. The material may be substantially similar to the element 108 and/or 110, described above with reference to FIG. 1. In an embodiment, a ring of a second material is disposed on the first substrate. In an embodiment, the ring of second material is substantially similar to the element 114 or the elements 304 and/or 306, as described above with reference to FIGS. 1 and 3, respectively. In an embodiment, a bonding site includes a region of the first substrate suitable for bonding with a material formed on the second substrate.

The method 500 then proceeds to step 504 where a second substrate is provided. Similar to the first substrate, the second substrate may be a MEMS substrate, a CMOS substrate, a capping substrate, and/or other suitable substrate. The second substrate may also be a wafer. The wafer may include a plurality of devices (or chips) formed thereon. In an embodiment, the second substrate may be substantially similar to the substrate 104, described above with reference to FIG. 1. The second substrate includes at least two bonding sites (e.g., two sites where a bond ring can be formed or adhered to) for each of a plurality of devices formed thereon. In an embodiment, a ring of a first material is provided on the second substrate, where the first material is a material suitable for eutectic bonding with a complementary material formed on the first substrate, discussed above. The material may be substantially similar to the element 108 and/or 110, described above with reference to FIG. 1. In an embodiment, a ring of a second material is disposed on the first substrate. In an embodiment, the ring of second material is substantially similar to the element 114 or the elements 304 and/or 306, described above with reference to FIG. 3. In an embodiment, a bonding site includes a region of the second substrate suitable for bonding with a material formed on the first substrate.

The method 500 then proceeds to step 506 where the first and second substrate are bonded together using at least two bond rings. The bonding of the first and second substrate includes aligning the bonding sites of the first and second substrate. The bonding may be performed controlling the force and/or temperature of the substrates such that a plurality of bond rings is formed. In an embodiment, the first bond ring is a eutectic bond and the eutectic point of the first bond ring is provided during the bonding process. The first bond ring may be substantially similar to the bond ring 106, described above with reference to FIG. 1. In an embodiment, the second bond ring is at least one of a eutectic bond and a bond provided by a polymer material. The second bond ring may be substantially similar to the bond ring 114, described above with reference to FIG. 1, and/or the bond ring 302, described above with reference to FIG. 3. In an embodiment, the second bond ring is a eutectic bond and the eutectic point of the second bond is provided during the bonding process. In an alternative embodiment, the second bond ring is a eutectic bond and the eutectic point of the second bond is not provided during the bonding process. This may allow the second bond ring to act as a bump for gap control of the substrates. The bonding process may be performed by equipment typical of the semiconductor industry including bonders such as those manufactured by EV Group, SUSS MicroTec, or other manufacturers known in the art. The bonding of step 506 may create a hermetic cavity within and/or between the two substrates. The cavity may be substantially similar to the region 112, described above with reference to FIG. 1 and may be surrounded by the bond rings. In an embodiment, the method 500 proceeds to subsequent steps including dicing the bonded substrates into a plurality of devices or chips.

Thus, provided are devices and/or methods that provide for a plurality of bond rings at the device level. The bond rings may be formed at the peripheral region of a chip and disposed around a hermetic cavity of the chip. A second or subsequent ring encircles an inner ring. Embodiments of the method 500 and/or the devices 100, 200, 300, and 400 offer one or more advantages over substrates bonded together with a single bond ring for each device. For example, a second (or third, etc) bond ring may shield an inner bond ring from being impacted chemically or physically by subsequent processing of the substrates and/or presence of residual chemicals on or between the substrates before or after dicing. Furthermore, the structural strength of the additional bond ring(s) may provide for increased management of the stress applied during the processing (such as bonding, dicing). This may reduce the risk of cracking the substrates during the dicing process. Thus, a device is more likely to retain the hermeticity provided by the bond ring(s). Furthermore, in some embodiments, additional bond ring(s) may serve as a bump that controls the gap between substrates.

Referring now to FIG. 6, illustrated is a layout diagram 600 of a first substrate 102 and a second substrate 104 bonded together. The first substrate 102 and the second substrate 104 are substantially as described above with reference to FIG. 1. The layout diagram 600 may be the layout associated with the device 100, also described above with reference to FIG. 1. The layout diagram 600 includes a plurality of devices 606. The devices 606 may be substantially similar to the device 200 after separation (dicing) into chips. Each device 606 includes a first bond ring 106 and a second bond ring 114, which are substantially similar to as described above with reference to FIG. 1. In an embodiment, the second bond ring 114 is omitted.

The layout 600 also illustrates a plurality of wafer-level bond rings 602 and 604 formed around the circumference of the substrates in the peripheral region. (Though two wafer-level bond rings are illustrated, any number of rings is within the scope of this disclosure). In an embodiment, the wafer-level bond rings 602 and 604 are within approximately 5 mm from the edge of the wafers.

The wafer-level bond ring 602 may include the same material as the wafer-level bond ring 602, or a different material. The wafer-level bond rings 602 and/or 604 may include an organic material. In an embodiment, the wafer-level bond rings 602 and/or 604 include a polymer material. In a further embodiment, wafer-level bond rings 602 and/or 604 are polyimide. Other example compositions include photoresist and/or other suitable materials. The wafer-level bond rings 602 and/or 604 composition may be selected for its compatibility with a CMOS process technology. In an embodiment, the material for the wafer-level bond rings 602 and/or 604 is formed on the second substrate 104 (e.g., CMOS wafer) prior to the bonding of the substrates. In an embodiment, the wafer-level bond rings 602 and/or 604 include the same material as the device-level bond ring 114, described above with reference to FIG. 1. The wafer-level bond rings 602 and/or 604 may provide a physical connection and not an electrical connection between wafers.

Referring now to FIG. 7, illustrated is a layout diagram 700 of a first substrate 102 and a second substrate 104 (e.g., wafers) bonded together. The first substrate 102 and the second substrate 104 are substantially similar to as described above with reference to FIG. 1. The layout diagram 700 may be the layout associated with the device 300, described above with reference to FIG. 3. The layout diagram 700 includes a plurality of devices 706. The devices 706 may be substantially similar to the device 400 after separation (dicing) into chips. Each device 706 includes a first bond ring 106 and a second bond ring 302, which are substantially similar to as described above with reference to FIGS. 1 and 3, respectively. In an embodiment, the second device level bond ring 302 is omitted.

The layout 700 also illustrates a plurality of wafer-level bond rings 702 and 704 formed around the circumference of the substrates (wafers) in a peripheral region. In an embodiment, the wafer-level bond rings 702 and 704 are within approximately 5 mm from the edge of the wafer. (Though two wafer-level bond rings are illustrated, any number of rings is within the scope of this disclosure). The wafer-level bond ring 702 may include the same material as wafer-level bond ring 704, or a different material. In an embodiment, the wafer-level bond rings 702 and 704 include the same material as the device-level bond ring 302 and/or device-level bond ring 106. The wafer-level bond rings 702 and/or 704 may be formed using a eutectic bond process. The materials combined to form the eutectic bond may be substantially similar to as described above (see, e.g., discussion of elements 304 and 306 of FIG. 3). In alternative embodiments, a eutectic composition (e.g., alloy) is deposited on one or more of the substrates 102 and 104. The wafer-level bond rings 702 and/or 704 may include a eutectic between any two materials (e.g., alloy) suitable eutectic bonding. For example, the eutectic bond (e.g., wafer-level bond rings 702 and/or 704) may include metal/metal bonding and/or metal/semiconductor bonding such as, Ge/Al bonding, Ge/Au bonding, Si/Au bonding, Si/Al bonding, Al/amorphous carbon bonding, In/Au bonding, Au/Au bonding, solder/Au eutectic bonding, and/or other suitable materials. As but one example, wafer-level bond rings 702 and/or 704 are eutectic bonds between germanium and aluminum. As another example, wafer-level bond rings 702 and/or 704 are eutectic bonds between silicon and gold. The wafer-level bond rings 702 and/or 704 may provide a physical connection and not an electrical connection between wafers.

Figure 8:
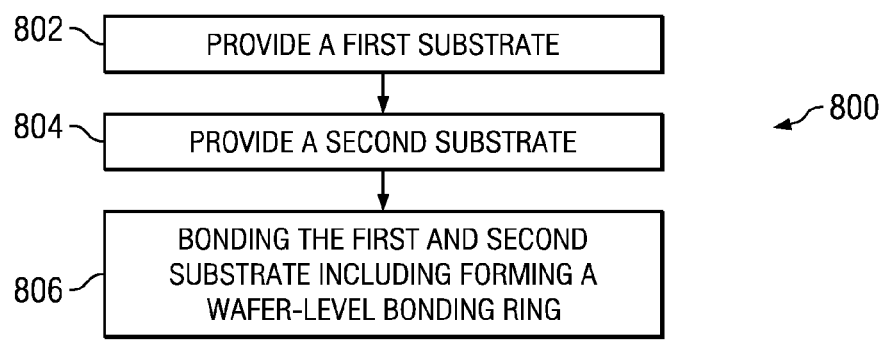
FIG. 8 is a flowchart illustrating an embodiment of a method of bonding two substrates according to aspects of the present disclosure.

Referring now to FIG. 8, illustrated is a method 800 which provides for bonding two substrates (e.g., wafers) together and includes forming a wafer-level bond ring. The method 800 may be used to fabricate bonded substrates such as depicted in the layout 600 and/or 700, described above with reference to FIGS. 6 and 7, respectively.

The method 800 begins at step 802 where a first substrate (e.g., wafer) is provided. In one example, the substrate is a silicon wafer. The wafer may alternatively or additionally include other elementary semiconductor, such as germanium. The wafer may also include a compound semiconductor, such as silicon carbide, gallium arsenic, indium arsenide, and indium phosphide. The first substrate may be a MEMS wafer, a CMOS wafer, a capping wafer, and/or any other suitable substrate.

The first wafer includes a wafer-level bonding ring region. The wafer-level bonding ring region may be provided near the edge (periphery) of the wafer, for example, in an exclusion area. In an embodiment, the wafer-level bonding ring region is less than approximately 5 mm from the edge of the wafer. The bonding ring region is suitable to provide a mechanical connection to another wafer. For example, the bonding ring region may include a polymer layer, as described above with reference to FIG. 6 and wafer-level bond rings 602 and 604. As another example, the bonding ring region may include an element on the first substrate, where the element includes a composition that is suitable for eutectic bonding, such as described above with reference to FIG. 7 and the wafer-level bond rings 702 and 704.

The method 800 then proceeds to step 804 where a second substrate (e.g., wafer) is provided. In one example, the substrate is a silicon wafer. The wafer may alternatively or additionally include other elementary semiconductors, such as germanium. The wafer may also include a compound semiconductor, such as silicon carbide, gallium arsenic, indium arsenide, and indium phosphide. The second substrate may be a MEMS wafer, a CMOS wafer, a capping wafer, and/or any other suitable substrate.

The second wafer includes a wafer-level bonding ring region. The wafer-level bonding ring region may be provided near the edge (e.g., periphery) of the wafer, for example, in an exclusion area. In an embodiment, the wafer-level bonding ring region is within approximately 5 mm from the edge of the wafer. The bonding ring region is suitable to provide a mechanical connection to another wafer. For example, the bonding ring region may include a polymer layer, as described above with reference to FIG. 6 and wafer-level bond rings 602 and 604. As another example, the bonding ring region may include an element on the second that is suitable for eutectic bonding, such as described above with reference to FIG. 7 and the wafer-level bond rings 702 and 704.

The method 800 then proceeds to step 806 where the first and second wafers are bonded together. The bonding process includes forming a wafer-level bond ring, or in other words, providing at least one bond ring around the circumference of the wafers in the peripheral region. In an embodiment, a wafer-level bond ring includes a polymer bonding material, similar to as described above with reference to the device-level bond ring 114 of FIG. 1. Thus, the embodiment provides a bond between the substrates such as indicated by the layout 600 and wafer-level bond rings 602 and/or 604, described above with reference to FIG. 6. In an embodiment, the wafer-level bond ring includes a eutectic bond. Thus, the embodiment provides a bond between the wafers such as indicated by the layout 700 and wafer-level bond rings 702 and/or 704, described above with reference to FIG. 7. The bonding process may be performed by equipment typical of the semiconductor industry including bonders such as those manufactured by EV Group, SUSS MicroTec, or other manufacturers known in the art. In an embodiment, one or more of the wafer-level bond rings may act as a bump providing and/or controlling a separation between wafers. In an embodiment, a wafer-level bonding region is formed on each substrate, and the materials are not brought to their eutectic point. Any number of bond rings may be formed on the substrate(s).

Thus, described are devices and methods that provide for one or more wafer-level bond rings formed between two bonded substrates (e.g., wafers). The wafer-level bond rings are provided around the circumference of the bonded wafers at the periphery of the wafers and provide a mechanical connection between the wafers. In an embodiment, one or more of the wafer-level bond rings includes an organic material such as a polymer (e.g., polyimide). In an embodiment, one or more of the wafer-level bond rings includes a eutectic bond.

The wafer-level bond rings may allow for protection of one or more devices (e.g., chips) provided on the wafer(s). For example, the wafer-level bond rings may protect the devices (e.g., including the device-level bond ring) from attack by chemical or physical impact from processing, such as TSV processes performed on the wafer(s). In some embodiments, the wafer-level bond rings may also act as a stress-buffer. This may reduce and/or avoid cracking while dicing the devices or chips. Any one of these advantages may allow for a device to maintain a well-sealed hermeticity region. In some embodiments, the wafer-level bond ring provides a bump to control the gap between bonded substrates.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures. Though illustrated herein as bonding two substrates, the present disclosure may be applicable to bonding any number of substrates.

Thus, an embodiment of a device is provided. The device includes a first substrate including a MEMS device and a second substrate bonded to the first substrate. The second substrate is bonded to the first substrate at a first bond ring and a second bond ring.

In an example of the embodiment of the device, a third bond ring encircles the first and second bond rings. In one embodiment, the first bond ring provides a hermetic region of the MEMS device.

The first and second bond rings may include several materials. For example, the first bond ring may be a eutectic bond. In an embodiment, the second bond ring is a eutectic bond. Examples include a material selected from the group consisting of germanium, aluminum, gold, and silicon. The bond rings may include different compositions of eutectic bonds. In another embodiment, the second bond ring includes an organic material, for example, polyimide.

The second bond ring may be adjacent to and encircle the first bond ring. In another embodiment, one bond ring may be a device-level bond ring and one may be a wafer-level bond ring. In an embodiment, the first substrate is a first wafer and the second substrate is a second wafer including a device fabricated using a CMOS-based process. The first wafer and the second wafer may include a third bond ring disposed at the periphery of the first wafer and the second wafer.

Another embodiment of a device is provided, which includes a first wafer bonded to a second wafer. The wafers are bonded together using at least one bond ring. The bond ring is disposed on the peripheral region on the first wafer and the second wafer. In one example, the bond ring includes an organic material, for example, polyimide. In another example, the bond ring is a eutectic bond. In some embodiments, the bond ring may be referred to as a wafer-level bond ring.

Further, a method of bonding a first and second substrate is provided. The method includes providing a first substrate, which includes a MEMS device, and a second substrate. The first substrate is bonded to the second substrate. The bonding includes forming a first bond ring and forming a second bond ring. The second bond ring encircles the first bond ring. In one example, forming the first bond ring includes forming a eutectic bond and forming the second bond ring includes at least one of forming a ring of organic material and forming a eutectic bond.

What is claimed is:

1. A method, comprising:
providing a first substrate, wherein the first substrate includes a first microelectromechanical system (MEMS) device and a second MEMS device;
providing a second substrate;
bonding the first substrate to the second substrate, wherein the bonding includes:
forming a first bond ring around the first MEMS device; and
forming a second bond ring around the second MEMS device, wherein the second bond ring also encircles the first bond ring;
wherein at least one of the forming the first bond ring and the forming the second bond ring includes forming a eutectic bond of Aluminum (Al) and amorphous-Silicon (a-Si).

2. The method of claim 1, wherein the forming the first bond ring includes forming the eutectic bond of Aluminum (Al) and amorphous-Silicon (a-Si) and forming the second bond ring includes forming a ring of organic material.

3. The method of claim 1, wherein the forming the first bond ring includes forming a first eutectic bond and forming the second bond ring includes forming a second eutectic bond wherein at least one of the first eutectic bond and the second eutectic bond includes the eutectic bond of Aluminum (Al) and amorphous-Silicon (a-Si).

4. The method of claim 1, wherein the forming the first bond ring includes forming a eutectic bond of Germanium (Ge) and Aluminum (Al) and forming the second bond ring includes forming the eutectic bond of Aluminum (Al) and amorphous-Silicon (a-Si).

5. The method of claim 1, wherein the at least one of the forming the first bond ring and the forming the second bond ring includes forming the second bond ring of the eutectic bond of Aluminum (Al) and amorphous-Silicon (a-Si).

6. A method of semiconductor device fabrication, comprising:
provinding a first substrate, wherein the first substrate includes a first material for forming a first bond ring and a second material for forming a second bond ring;
providing a second substrate including a third material for forming the first bond ring and a fourth material for forming the second bond ring; and
bonding the second substrate to the first substrate, wherein the bonding reaches a first temperature and includes:
forming a eutectic bond of the first bond ring to couple the first and second substrates by bringing the first and second substrates to the first temperature, wherein the first temperature is a eutectic point of the first and third materials; and
using the second and fourth materials to define a gap distance between the bonded first and second substrates, wherein the second and fourth materials have a eutectic point higher than the first temperature.

7. The method of claim 6, wherein the second bond ring encircles the first bond ring.

8. The method of claim 7, wherein the gap distance is less than approximately 100 μm.

9. The method of claim 6, wherein the first material includes germanium (Ge) and the second material includes Aluminum (Al).

10. The method of claim 6, wherein the third material includes Aluminum (Al) and the fourth material includes amorphous-Silicon (a-Si).

11. The method of claim 6, wherein the providing the first substrate includes providing a substrate having a microelectromechanical system (MEMS) device disposed thereon.

12. The method of claim 11, wherein the providing the first substrate includes providing the first material disposed in a ring encircling the MEMS device.

13. The method of claim 6, wherein the providing the second substrate includes forming a complementary metal oxide semiconductor (CMOS) device on the second substrate.

14. The method of claim 6, wherein the bonding does not reach the eutectic point of the second and fourth materials.

15. The method of claim 6, further comprising:
dicing the bonded first and second substrates into a plurality of devices, wherein one of the plurality of devices includes the first bond ring and the second bond ring.

16. A method, comprising:
providing a first substrate and a second substrate;
bonding the first substrate to the second substrate, wherein the bonding includes:
forming a first bond ring by forming a eutectic bond between first materials having a first eutectic point; and
forming a second bond ring comprising second materials and encircling the first bond ring, wherein the second materials have a second eutectic point greater than the first eutectic point, and wherein the bonding includes providing a temperature reaching the first eutectic point and not providing a temperature of the second eutectic point.

17. The method of claim 16, wherein the second bond ring includes an Aluminum (Al) and amorphous-Silicon (a-Si) bond.

18. The method of claim 17, wherein the first bond ring includes a Germanium (Ge) and Aluminum (Al) bond.

19. The method of claim 16, further comprising:
forming a third bond ring including polyimide.

20. The method of claim 16, wherein the providing the first and second substrate includes providing at least one microelectromechanical system (MEMS) device.

21. The method of claim 20, wherein the forming the first bond ring provides a hermetic cavity for the at least one MEMS device.

* * * * *